(12) United States Patent
Igarashi

(10) Patent No.: US 6,426,906 B1
(45) Date of Patent: Jul. 30, 2002

(54) READ-OUT CIRCUIT

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/941,722

(22) Filed: Aug. 30, 2001

(30) Foreign Application Priority Data

Sep. 26, 2000 (JP) ........................................ 2000-291537

(51) Int. Cl.[7] ................................................ G11C 7/00

(52) U.S. Cl. ...................... 365/204; 365/203; 365/205; 365/145

(58) Field of Search ................................ 365/204, 203, 365/205, 145

(56) References Cited

U.S. PATENT DOCUMENTS 5,978,250 A * 11/1999 Chung et al. ................ 365/145
6,144,601 A * 11/2000 Takeda ........................ 365/203

OTHER PUBLICATIONS

FRAM Inc. Card Gijutsu (FRAM IC Card Technology) PP35–40, 1999.

* cited by examiner

Primary Examiner—Huan Hoang
(74) Attorney, Agent, or Firm—Venable; Norman N. Kunitz

(57) ABSTRACT

A read-out circuit capable of achieving an improvement in the reliability of a reference potential generating cell by utilizing a 1T-1C (one transistor-one ferroelectric capacitor) type FRAM which enables a reduction in area to constitute the reference potential generating cell is provided. A read-out circuit that amplifies a binary signal through a sense amplifier and reads out the amplified signal as a bit line potential is provided with a 0-level setting circuit that resets the lower potential signal in the binary signal to 0 V at a stage preceding the sense amplifier. By adopting this structure, a constant potential can be used as a reference potential, to achieve stable operation. In addition since a constant potential can be used as the reference potential, the degree of change occurring over time can be reduced. Furthermore, since the capacity of the reference potential line does not require a particularly large capacity, the power consumption during a read-out operation can be reduced.

12 Claims, 10 Drawing Sheets

READ-OUT CIRCUIT

BACKGROUND OF THE INVENTION

The present invention relates to a read-out circuit in a ferroelectricity memory.

The publication "FRAM IC Card Technology" (Hidemi Takasu and Toshinori Takuma, published by: Science Forum, 1999, p.p. 35–40) explains the basic operation of a 1T-1C (one transistor-one ferroelectric capacitor) type ferroelectricity (FeRAM) and clarifies the problems arising therein.

DESCRIPTION OF THE RELATED ART

It has been noted that a reference potential generating cell (also referred to as a dummy memory cell), which is accessed more frequently compared to data memory cells, quickly becomes degraded to result in the reduction in the degree of change in the electrical charge occurring during a polarization inversion and a lower reference potential.

When a 1T-1C type FRAM is used to constitute a reference potential generating cell, too, the reference potential generating cell which is accessed more frequently than data memory cells becomes degraded readily, resulting in a reduction in the degree of change in the electrical charge occurring during a polarization inversion and a lower reference potential, as described above. Thus, a problem in that an erroneous read-out tends to occur readily arises.

In addition, while the publication mentions a 2T-2C type FRAM as a means for improving the reliability, it also asserts that since its memory cell array area is almost double the memory cell array area of the 1T-1C FRAM, its use will become extremely limited as further miniaturization is pursued in the future.

The main object of the present invention, which has been completed by addressing the problem of read-out circuits in the prior art, is to provide a new and improved read-out circuit through which the reliability of the reference potential generating cell is improved while utilizing a 1T-1C type FRAM with a smaller area to constitute the reference potential generating cell.

SUMMARY OF THE INVENTION

In order to achieve the object described above, the read-out circuit according to the present invention that amplifies a binary signal through a sense amplifier and reads out the amplified signal as a bit line potential is provided with a potential setting circuit that resets the signal corresponding to the lower potential in the binary signal to a given potential, at a stage preceding the stage at which the sense amplifier is provided. It is to be noted that the potential setting circuit may reset the lower potential signal to a potential near 0 V.

By adopting this structure in which a constant potential can be used as the reference potential, stable operation is realized. In addition, since a constant potential is used as the reference potential, the degree of change occurring over time can be reduced. Furthermore, since the reference potential line is not required to have a large capacity, the power consumption during a read-out operation can be reduced.

It is desirable that the potential setting circuit include a transistor the substrate potential of which can be set freely and that the operating point of the potential setting circuit can be adjusted via the transistor substrate potential. When such a structure is adopted, the operating point can be adjusted in conformance to the characteristics of the ferroelectric capacitor when the process is completed. As a result, the operating point of the potential setting circuit can be set freely for a specific use.

In addition, it is desirable that the potential setting circuit include a transistor and another transistor that is provided to forcibly discharge the charge stored at the gate of the first transistor. In such a structure, the electrical charge stored at the gate of the first transistor is forcibly discharged even during a high-speed operation, eliminating any residual charge at the gate, to enable stable operation.

Moreover, the read-out circuit according to the present invention that amplifies a binary signal through a sense amplifier and reads out the amplified signal as a bit line potential, having, a potential setting circuit that resets a lower potential signal in the binary signal to a given potential, provided at a stage preceding the sense amplifier, wherein, the potential setting circuit includes, a first transistor having a gate thereof connected to a bit line, which is turned on when the potential generated at the bit line is equal to or lower than a specific threshold voltage, and a second transistor which is turned on in response to the first transistor entering an ON state and resets the potential at the bit line to a given potential is provided.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the read-out circuit according to the present invention, given in reference to the attached drawings. It is to be noted that the same reference numbers are assigned to components having essentially identical functions and structural features in the specification and the drawings, to preclude the necessity for repeated explanation thereof.

First Embodiment

Figure 1:
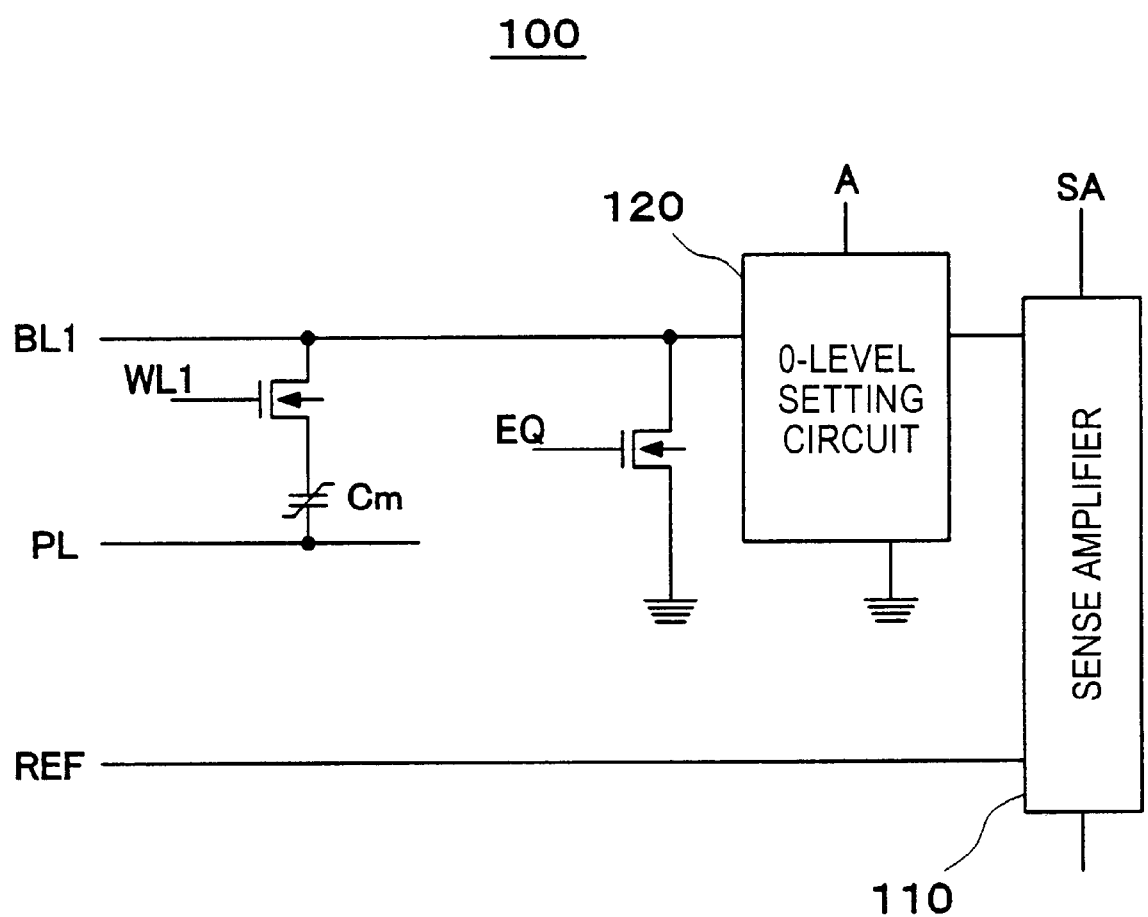
FIG. 1 illustrates the read-out circuit in a first embodiment.
Figure 2:
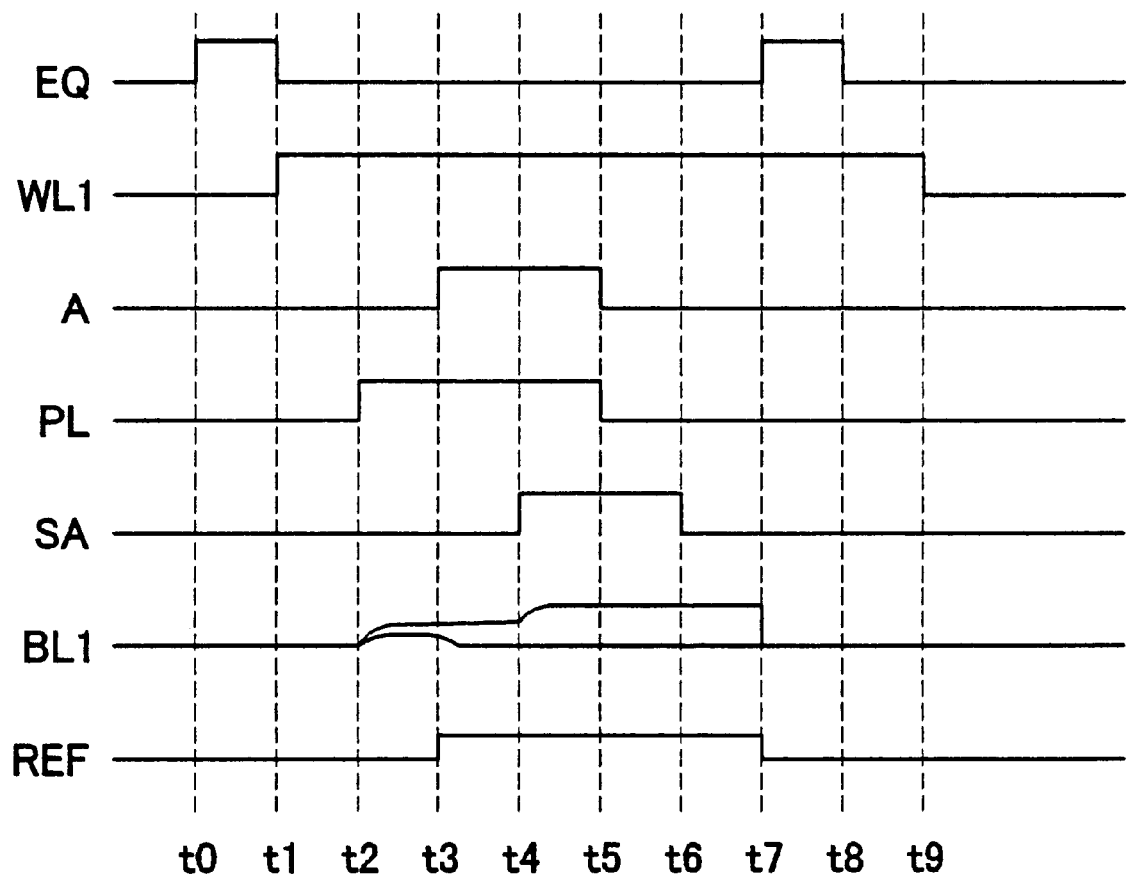
FIG. 2 is a timing chart of the read-out and the rewrite.
Figure 3:
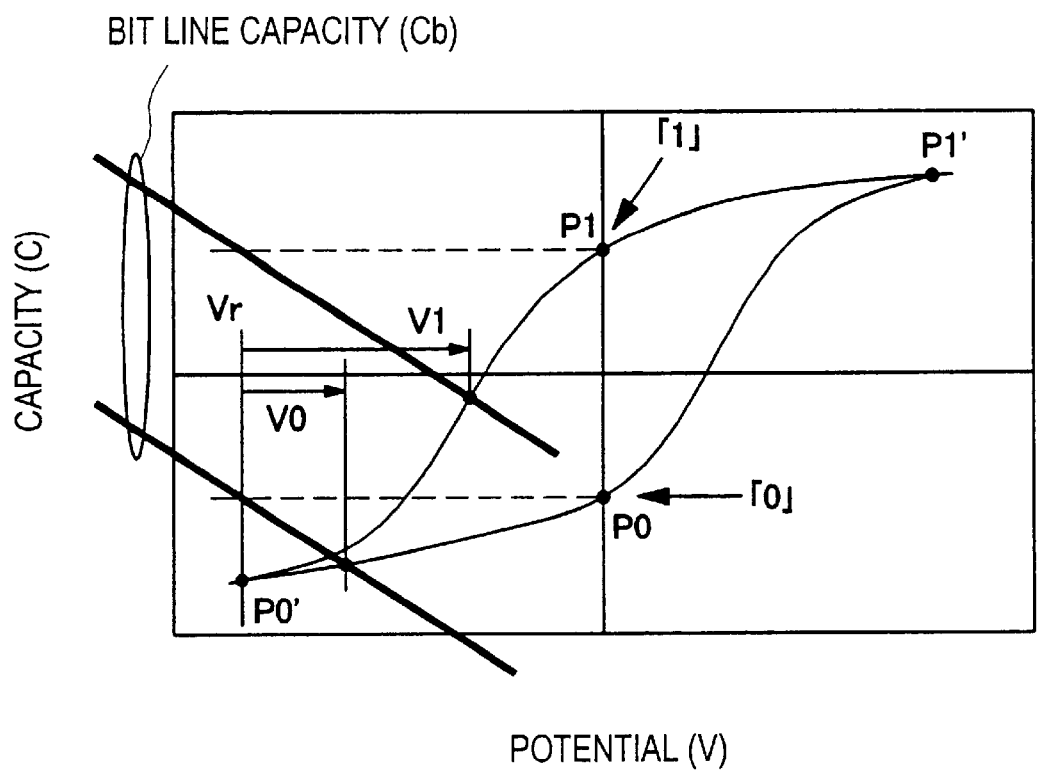
FIG. 3 illustrates the relationship between the potential and the bit line capacity.

The first embodiment of the present invention is now explained in reference to FIGS. 1–3.

A read-out circuit 100 that reads out stored data in a 1T-1C type FRAM (hereafter simply referred to as the "read-out circuit") in the embodiment is characterized in that it includes a 0-level setting circuit 120 provided between a sense amplifier 110 and a bit line BL1 as shown in FIG. 1.

The 0-level setting circuit 120 engages in operation prior to the sense amplifier operation during a read-out to drive the potential at the bit line BL1 to 0 V when the potential at the bit line BL1 is currently set to "0".

A constant voltage should be supplied to a terminal SA as a reference potential Vref.

FIG. 2 presents a timing chart of the read-out and the rewrite. In the initial state, all the terminals are set at 0 V. First, the level of an equalize signal EQ is raised at a time point t0 to charge the bit line BL1 so as to set the bit line BL1 to 0 V.

After lowering the level of the equalize signal EQ at a time point t1, the level at a word line WL1 is raised to connect a memory cell Cm to the bit line BL1.

At a time point t2, a source potential Vcc is applied to a plate line PL and the information in the memory cell Cm is read-out to the bit line BL1. The level of the potential generated at the bit line BL1 at this point varies depending upon the polarization state of the memory cell Cm. It is assumed that the memory cell Cm is capable of holding information indicating "1" with a residual dielectric polarization P1 and holding information indicating "0" with a residual dielectric polarization P0, as shown in FIG. 3. When information has been written, the memory cell Cm must have either the residual dielectric polarization P1 or the residual dielectric polarization P0.

When the memory cell Cm has the residual dielectric polarization P1, a read-out voltage Vr is divided at the serial circuit constituted of the memory cell Cm and a bit line capacitor Cb by applying the read-out voltage Vr to the plate line PL, resulting in a bit line voltage V1 generated at the two ends of the bit line capacitor Cb, i.e., at the bit line BL1. Likewise, when the. memory cell Cm has the residual dielectric polarization P0, the read-out voltage Vr is divided at the serial circuit constituted of the memory cell Cm and the bit line capacitor Cb by applying the read-out voltage Vr to the plate line PL, resulting in a bit line voltage V0 generated at the bit line BL1.

The level at a terminal A is raised at a time point t3 to drive the 0-level setting circuit 120. The 0-level setting circuit 120 has a function of setting only the information indicating "0", i.e., the bit line voltage V0 induced by the residual dielectric polarization P0, to 0V.

Now, the operation of the 0-level setting circuit 120 is explained.

The 0-level setting circuit 120 has a threshold voltage Vr0. The threshold voltage Vr0 is set by ensuring that; bit line voltage V0<threshold voltage Vr0<bit line voltage V1. It is known that as presented as an example in FIG. 4, the characteristics (capacity) on the side on which the polarization is inverted tend to charge readily whereas the characteristics (capacity) on the polarization non-inversion side are relatively stable when the ferroelectric characteristics become degraded due to fatigue or the like. Thus, it is desirable to set the threshold voltage Vr0 toward the side on which the polarization is not inverted during a read-out, i.e., closer to the low potential side (toward the bit line voltage V0) of the voltage generated at the bit line BL1, to ensure stable operation.

The operation of the 0-level setting circuit 120 is performed as described below.

If the potential generated at the bit line BL is equal to or lower than the threshold voltage Vr0 ("0" state), the bit line BL is grounded.

If the potential generated at the bit line BL is higher than the threshold voltage Vr0 ("1" state), the bit line BL is floated to sustain the potential.

At a time point t4, the level at the terminal SA is raised to amplify the information at the bit line BL1 with the sense amplifier 110, i.e., to amplify the "1" state to the source potential Vcc and amplify the "0" state to 0 V. It is assumed that a given constant voltage is supplied to the sense amplifier 110 as the reference potential Vref at this point. Since the potential at the bit line BL1 is set to 0 V in advance by the 0-level setting circuit 120 if information indicating "0" is present at the bit line BL1, the reference potential Vref needs only to be at a level which corresponds to the detection sensitivity of the sense amplifier 110. For instance, if the detection sensitivity of the sense amplifier 110 is 300 mV, the reference potential Vref may be set to Vref>300 mV.

In addition, since the bit line voltage V1 is generated at the bit line BL1 if information indicating "1" is present at the bit line BL1, the reference potential Vref should be set to 300 mV<reference potential Vref<bit line voltage V1 by taking into consideration the detection sensitivity of the sense amplifier 110. As the example presented in FIG. 4 indicates, it is known that when the ferroelectric characteristics have been degraded due to fatigue or the like, the characteristics on the side on which the polarization becomes inverted tend to change readily whereas the characteristics (capacity) on the polarization non-inversion side remain relatively stable. Thus, it is desirable to set the reference potential Vref to a low level within the setting range. The potential on the low potential side, which is sustained by the 0-level setting circuit 120 at a constant level of 0 V and does not change over time, is stable.

In the polarization state shown in FIG. 3, P1 changes to P0' and then to P0 if the memory cell Cm, whereas P0 changes to P0' (the "0" state is written again) if the "0" state has been written in the memory cell Cm.

At a time point t5, the levels at the terminal A and the plate line PL are set to 0 V. In the polarization state shown in FIG. 3, P0 changes to P1' and the "1" state is written again if the "1" state has been written in the memory cell Cm, whereas P0' changes to P0 if the "0" state has been written in the memory cell Cm.

At a time point t6, the bit line BL1 is caused to float by setting the level at the terminal SA to 0 V. In the polarization state shown in FIG. 3, P1' changes to P1 if the "1" state has been written in the memory cell Cm, whereas P0 is held if the "0" state has been written in the memory cell Cm, thereby ending rewrite of either data.

At a time point t7, the level of the equalize signal EQ is raised to set the bit line BL1 to 0V.

At a time point t8, the level of the equalize signal EQ is lowered to float the bit line BL1, and then the level at the word line WL1 is lowered at a time point t9 to complete the read-out/rewrite operation.

As explained in detail above, since a constant potential can be utilized as the reference potential in the embodiment, a higher degree of stability is achieved and the degree of change occurring over time is reduced compared to the method in which the reference potential is generated by a dedicated capacitor, as explained as the prior art. In addition, since a constant potential Vref is supplied as the reference potential, the reference potential line does not require a particularly large capacity. As a result, a reduction in the power consumption is realized.

It is to be noted that while the 0-level setting circuit 120 in the embodiment includes a ground line, this line may be utilized as a terminal through which an arbitrary level of voltage is supplied instead of grounding it. In such a case, the bit line potential is set in correspondence to the arbitrary voltage applied to the ground line of the 0-level setting circuit 120 in the "0" state.

Second Embodiment

Figure 4:
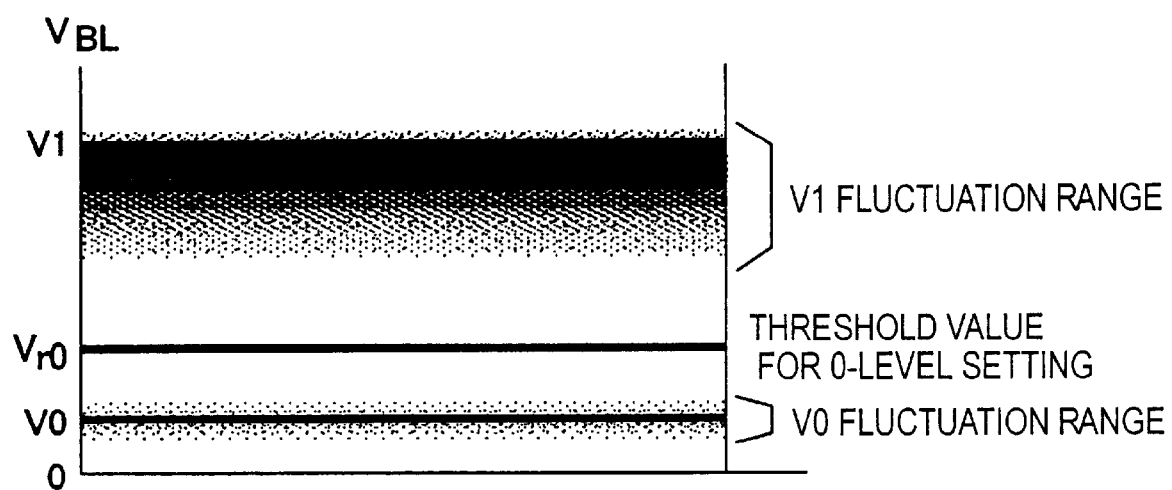
FIG. 4 illustrates the range of the bit line voltage fluctuation.
Figure 5:
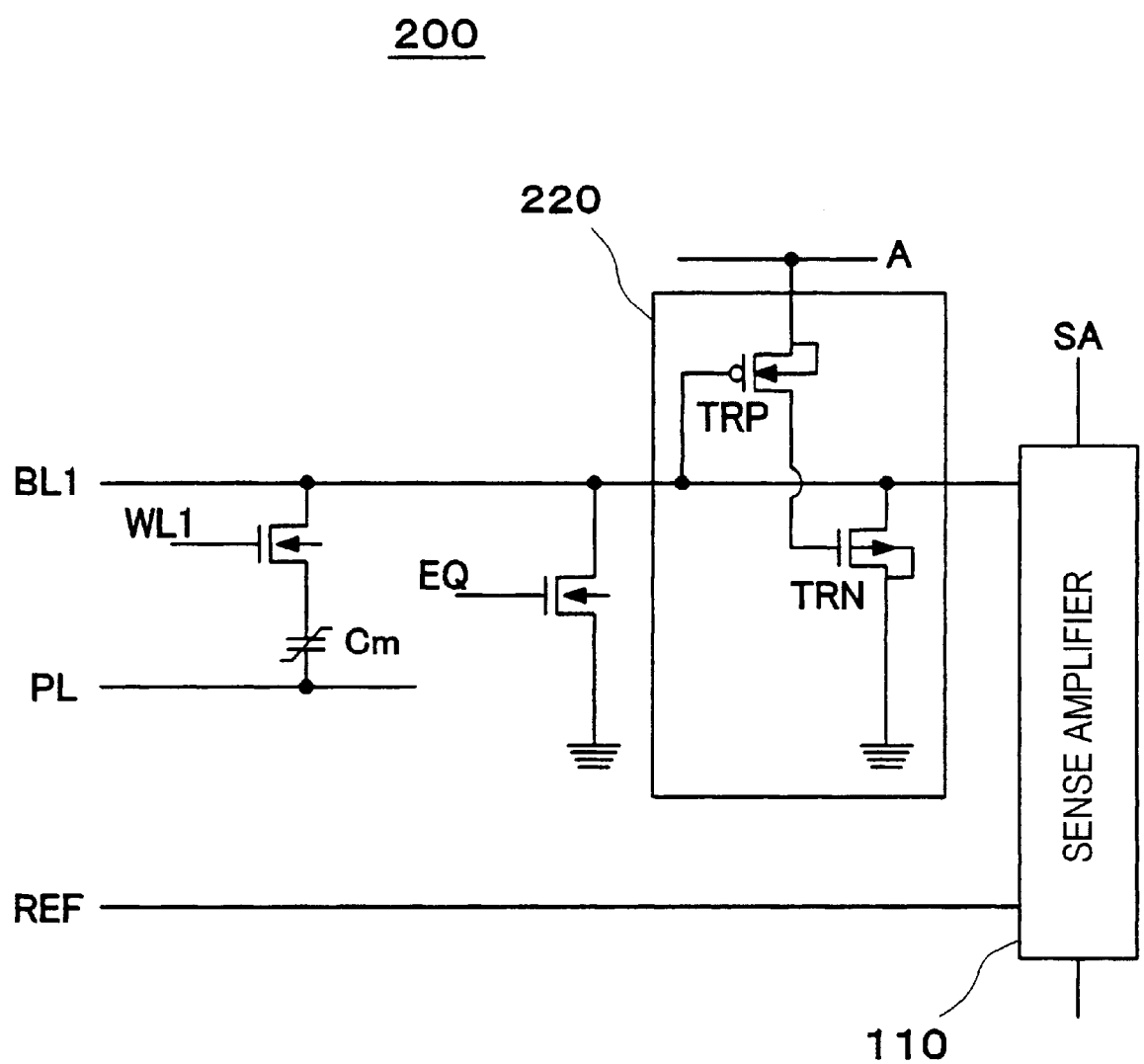
FIG. 5 illustrates the read-out circuit in a second embodiment.
Figure 6:
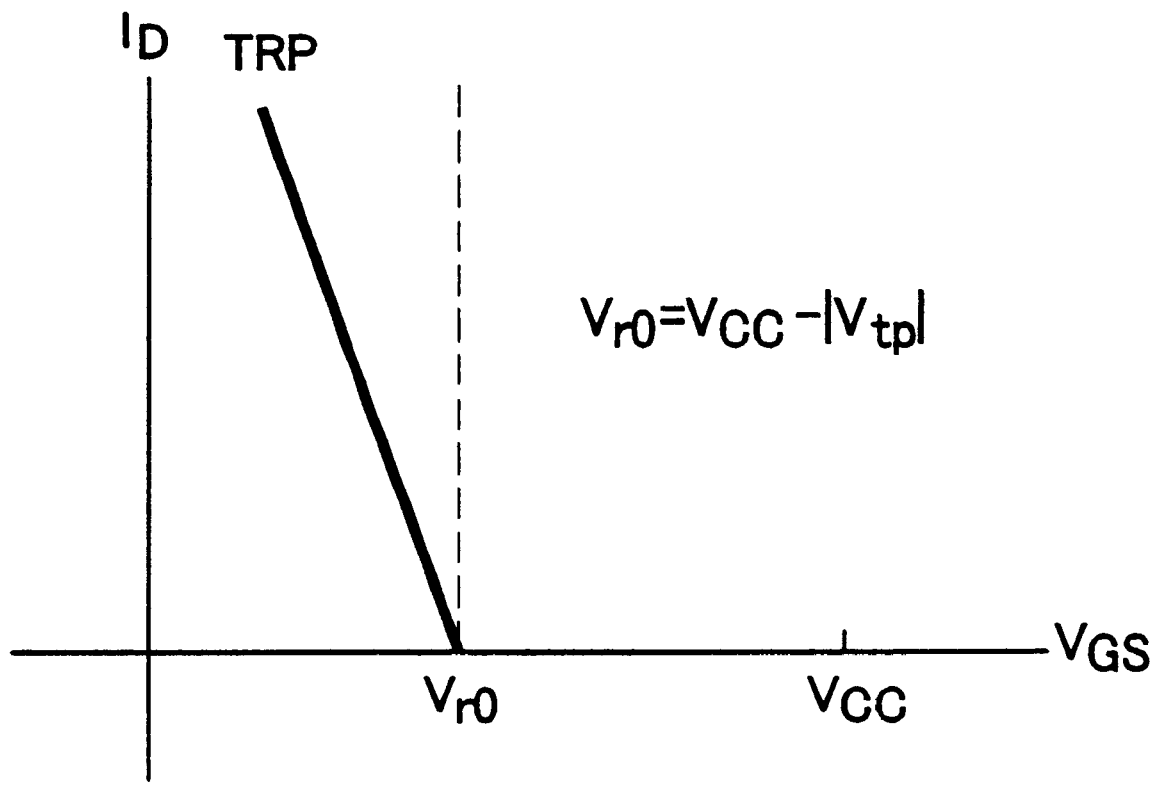
FIG. 6 presents a diagram provided to illustrate the threshold voltage (operating point) setting for the 0-level setting circuit.

The second embodiment of the present invention is now explained in reference to FIGS. 4~6. In reference to the embodiment, the circuit illustrated in FIG. 5 is explained as an example of the 0-level setting circuit mentioned earlier. A 0-level setting circuit 220 comprises an enhancement-type PMOS transistor TRP and an enhancement-type NMOS transistor TRN as shown in FIG. 5. It is assumed that the transistor TRP is constituted of a PMOS with a small W/L shape and a low drive force.

The 0-level setting circuit 220 engages in operation prior to the sense amplifier operation during a read-out to drive the bit line potential to 0 V when the potential at bit line BL1 is currently set to "0".

A constant voltage should be supplied to a terminal SA as a reference potential Vref.

FIG. 2 presents a timing chart of the read-out and the rewrite. In the initial state, all the terminals are set at 0 V. First, an equalize signal EQ is raised at a time point t0 to charge the bit line BL1 so as to set the bit line BL1 to 0 V.

After lowering the level of the equalize signal EQ at a time point t1, the level at a word line WL1 is raised to connect a memory cell Cm to the bit line BL1.

At a time point t2, a source potential Vcc is applied to a plate line PL and the information in the memory cell Cm is read-out to the bit line BL1. The level of the potential generated at the bit line BL1 at this point varies depending upon the polarization state of the memory cell Cm. It is assumed that the memory cell Cm is capable of holding information indicating "1" with a residual dielectric polarization P1 and holding information indicating "0" with a residual dielectric polarization P10, as shown in FIG. 3. When information has been written, the memory cell Cm must have either the residual dielectric polarization P1 or the residual dielectric polarization P0.

When the memory cell Cm has the residual dielectric polarization P1, a read-out voltage Vr is divided at the serial circuit constituted of the memory cell Cm and a bit line capacitor Cb by applying the read-out voltage Vr to the plate line PL, resulting in a bit line voltage V1 generated at the two ends of the bit line capacitor Cb, i.e., at the bit line BL1. Likewise, when the memory cell Cm has the residual dielectric polarization P0, the read-out voltage Vr is divided at the serial circuit constituted of the memory cell Cm and a bit line capacitor Cb by applying the read-out voltage Vr to the plate line PL, resulting in a bit line voltage V0 generated at the bit line BL1.

The level at a terminal A is raised at a time point t3 to drive the 0-level setting circuit 220. The 0-level setting circuit 220 has a function of setting only the information indicating "0", i.e., the bit line voltage V0 induced by the residual dielectric polarization P0, to 0V.

Now, the operation of the 0-level setting circuit 220 is explained.

The threshold voltage Vr0 of the 0-level setting circuit 220 is set at; threshold voltage Vr0=source potential Vcc−|threshold voltage Vtp|in correspondence to the threshold voltage Vtp at the transistor TRP as shown in FIG. 6. If a voltage higher than the threshold voltage Vr0 is applied to the gate of the transistor TRP, the connection between the source and the drain is electrically open, the potential at the gate of the transistor TRN is held at a low level, the connection between the source and the drain of the transistor TRN is electrically open and the bit line BL1 is caused to float.

If a voltage lower than the threshold voltage Vr0 is applied to the gate of the transistor TRP, the connection between the source and the drain is electrically shorted, the potential at the terminal A is applied to the gate of the transistor TRN, the connection between the source and the drain of the transistor TRN is electrically shorted and the bit line BL1 is grounded.

The threshold voltage Vr0 is set by ensuring that; bit line voltage V0<threshold voltage Vr0<bit line voltage V1. It is known that, as presented as an example in FIG. 4, the characteristics (capacity) on the side on which the polarization is inverted tend to change readily whereas the characteristics (capacity) on the polarization non-inversion side are relatively stable when the ferroelectricity characteristics become degraded due to fatigue or the like. Thus, it is desirable to set the threshold voltage Vr0 toward the side on which the polarization is not inverted during a read-out, i.e., closer to the low potential side (toward the bit line voltage V0) of the voltage generated at the bit line BL1, to ensure stable operation.

The operation of the 0-level setting circuit 220 is performed as described below.

If the potential generated at the bit line BL1 is equal to or lower than the threshold voltage Vr0 ("0" state), the bit line BL1 is grounded.

If the potential generated at the bit line BL1 is higher than the threshold voltage Vr0 ("1" state), the bit line BL1 is floated to sustain the potential.

At a time point t4, the level at the terminal SA is raised to amplify the information at the bit line BL1 with the sense amplifier 110, i.e., to amplify the "1" state to the source potential Vcc and amplify the "0" state to 0 V. It is assumed that a given constant voltage is supplied to the sense amplifier 110 as the reference potential Vref at this point. Since of the potential at the bit line BL1 is set to 0 V in advance by the 0-level setting circuit if information indicating "0" is present at the bit line BL1, the reference potential Vref needs only to be at a level which corresponds to the detection sensitivity of the sense amplifier 110. For instance, if the detection sensitivity of the sense amplifier 110 is 300 mV, the reference potential Vref may be set to Vref>300 mV.

In addition, since the bit line voltage V1 is generated at the bit line BL1 if information indicating "1" is present at the bit line BL1, the reference potential Vref should be set to; 300 mV<reference potential Vref<bit line voltage V1 but also taking into consideration the detection sensitivity of the sense amplifier 110. As the example presented in FIG. 4 indicates, it is known that when the ferroelectricity characteristics have been degraded due to fatigue or the like, the characteristics on the side on which the polarization becomes inverted tend to change readily whereas the characteristics (capacity) on the polarization non-inversion side remain relatively stable. Thus, it is desirable to set the reference potential Vref to a low level within the setting range. The potential on the low potential side, which is sustained by the 0-level setting circuit 220 at a constant level of 0 V and does not change over time, is stable.

In the polarization state shown in FIG. 3, P1 changes to P0' and then to P0 if the "1" state has been written in the memory cell Cm, whereas P0 changes to P0' (the "0" state is written again) if the "0" state has been written in the memory cell Cm.

At a time point t5, the levels at the terminal A and the plate line PL are set to 0 V. In the polarization state shown in FIG. 3, P0 changes to P1' and the "1" state is written again if the "1" state has been written in the memory cell Cm, whereas P0' changes to P0 if the "0" state has been written in the memory cell Cm.

At a time point t6, the bit line BL1 is caused to float by setting the level at the terminal SA to 0 V. In the polarization state shown in FIG. 3, P1' changes to P1 if the "1" state has been written in the memory cell Cm, whereas P0 is held if the "0" state has been written in the memory cell Cm, thus the rewrite of either data ends.

At a time point t7, the level of the equalize signal EQ is raised to set the bit line BL1 to 0V.

At a time point t8, the level of the equalize signal EQ is lowered to float the bit line BL1, and then the level at the word line WL1 is lowered at a time point t9 to complete the read-out/rewrite operation.

As explained in detail above, in the embodiment provided with the 0-level setting circuit 220 constituted of only two transistors, as shown in FIG. 5, the device area is minimized. In addition, since a constant potential can be utilized as the reference potential, a higher degree of stability is achieved and only a lesser degree of change occurs over time compared to the method in which the reference potential is generated by a dedicated capacitor, as explained as the prior art. Furthermore, since a constant potential Vref is supplied as the reference potential, the reference potential line does not require a particularly large capacity. As a result, a reduction in the power consumption is realized.

Third Embodiment

Figure 7:
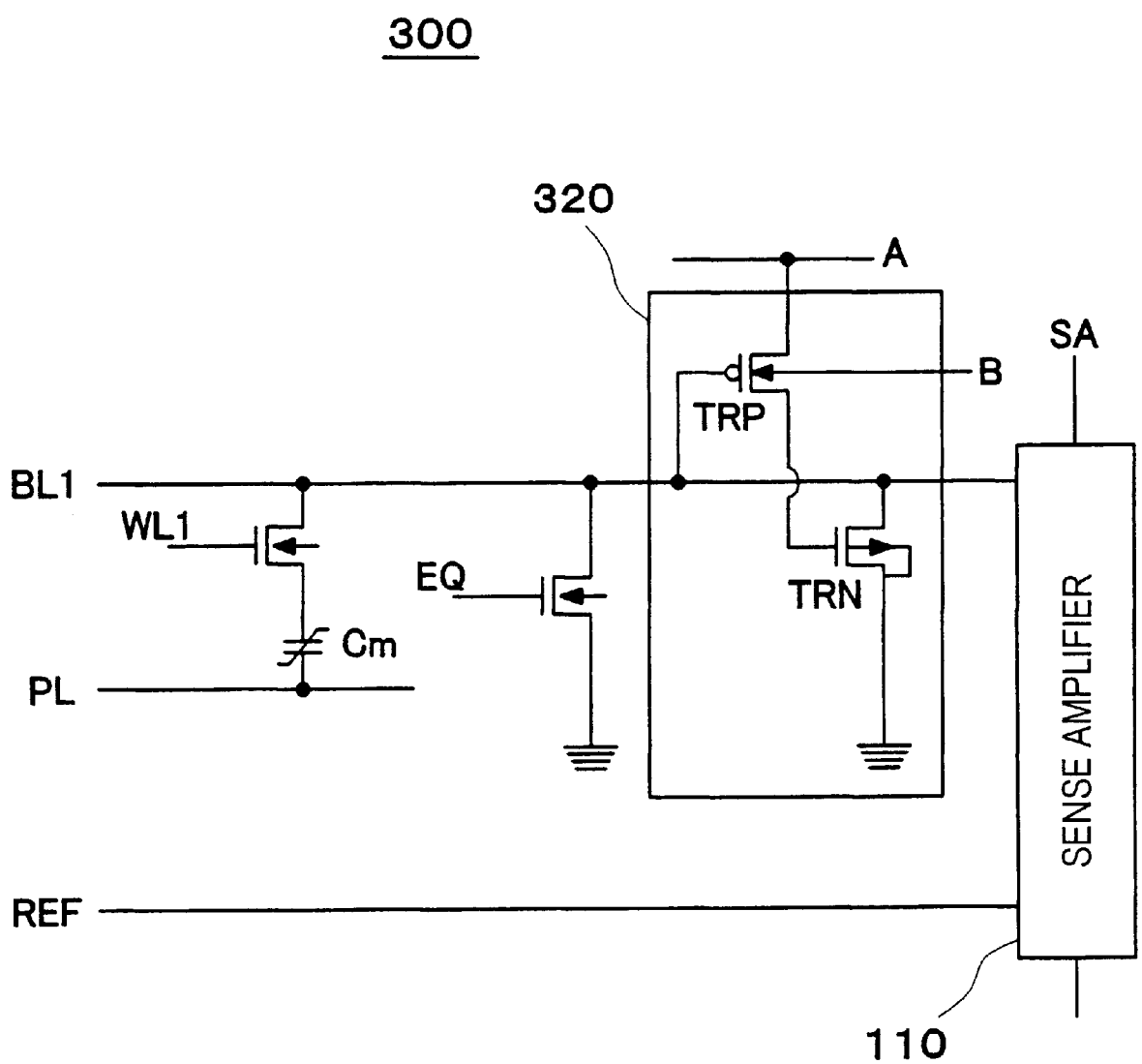
FIG. 7 illustrates the read-out circuit in a third embodiment.
Figure 8:
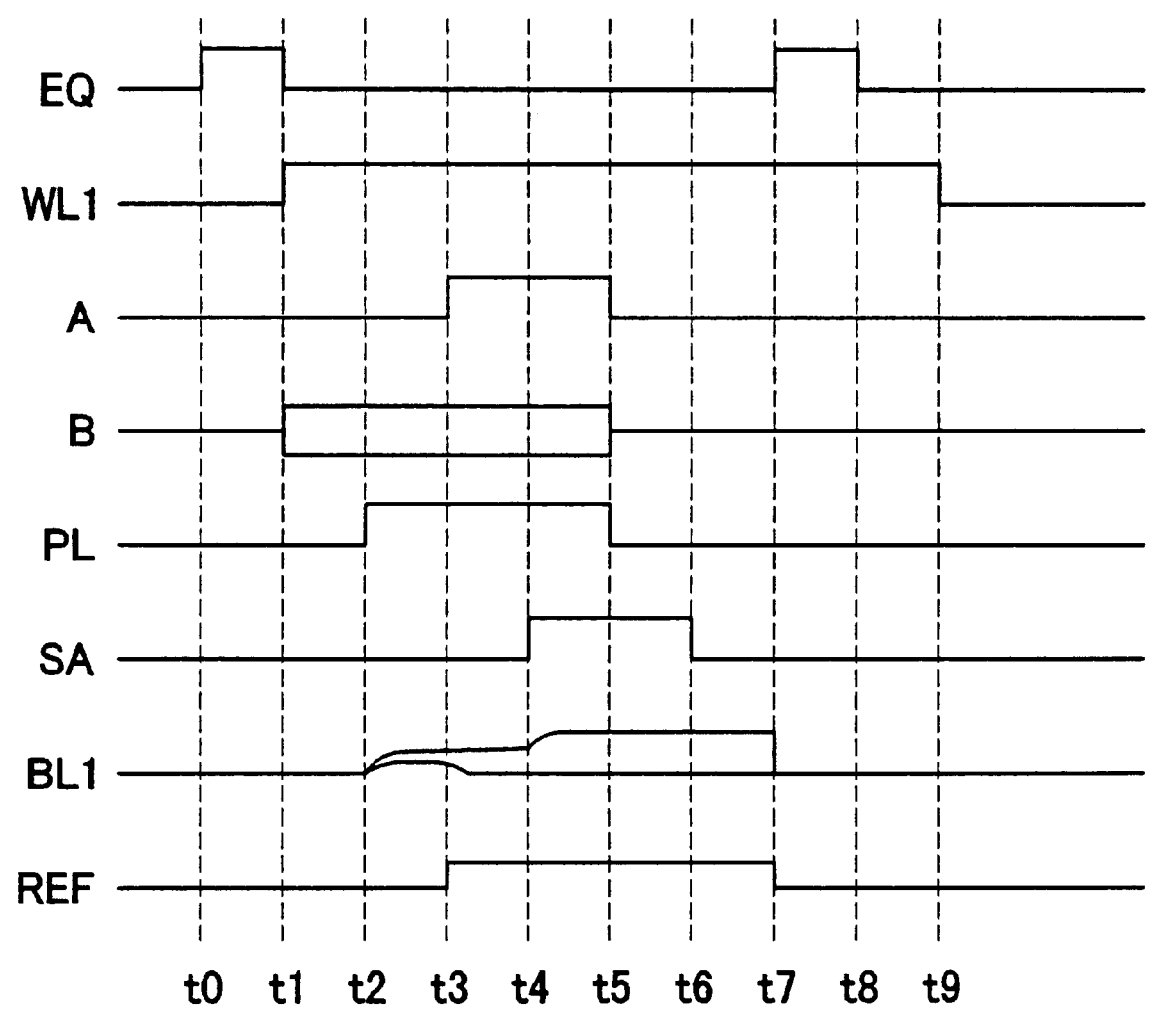
FIG. 8 is a time chart of the read-out and the rewrite.

The third embodiment of the present invention is now explained in reference to FIGS. 7 and 8. In reference to the embodiment, the circuit illustrated in FIG. 7 is explained as an example of the 0-level setting circuit mentioned earlier. A 0-level setting circuit 320 comprises an enhancement-type PMOS transistor TRP and an enhancement-type NMOS transistor TRN as shown in FIG. 7. It is assumed that the transistor TRP is constituted of a PMOS with a small W/L shape and a low drive force. In addition, the substrate potential at the transistor TRP can be extracted through a terminal B for control.

The 0-level setting circuit 320 engages in operation prior to the sense amplifier operation during a read-out to drive the bit line potential to a voltage Vbb which has been arbitrarily set when the potential at the bit line BL1 is currently set to "0".

A constant voltage should be supplied to a terminal SA as a reference potential Vref.

FIG. 8 presents a timing chart of the read-out and the rewrite. In the initial state, all the terminals are set at 0 V. First, an equalize signal EQ is raised at a time point t0 to charge the bit line BL1 so as to set the bit line BL1 to 0 V.

After lowering the level of the equalize signal EQ at a time point t1, the level at a word line WL1 is raised to connect a memory cell Cm to the bit line BL1. The arbitrary voltage Vbb is applied to a terminal B.

At a time point t2, a source potential Vcc is applied to a plate line PL and the information in the memory cell Cm is read-out to the bit line BL1. The level of the potential generated at the bit line BL1 at this point varies depending upon the polarization state of the memory cell Cm. It is assumed that the memory cell Cm is capable of holding information indicating "1" with a residual dielectric polarization P1 and holding information indicating "0" with a residual dielectric polarization P0, as shown in FIG. 3. When information has been written, the memory cell Cm must have either the residual dielectric polarization P1 or the residual dielectric polarization P0.

When the memory cell Cm has the residual dielectric polarization P1, a read-out voltage Vr is divided at the serial circuit constituted of the memory cell Cm and a bit line capacitor Cb by applying the read-out voltage Vr to the plate line PL, resulting in a bit line voltage V1 generated at the two ends of the bit line capacitor Cb, i.e., at the bit line BL1. Likewise, when the memory cell Cm has the residual dielectric polarization P0, the read-out voltage Vr is divided at the serial circuit constituted of the memory cell Cm and the bit line capacitor Cb by applying the read-out voltage Vr to the plate line PL, resulting in a bit line voltage V0 generated at the bit line BL1.

The level at a terminal A is raised at a time point t3 to drive the 0-level setting circuit 320. The 0-level setting circuit 320 has a function of setting only the information indicating "0", i.e., the bit line voltage V0 induced by the residual dielectric polarization P0, to 0V.

Now, the operation of the 0-level setting circuit 320 is explained.

The threshold voltage Vr0 of the 0-level setting circuit 320 is set at; threshold voltage Vr0=source potential Vcc−|threshold voltage Vtp|in correspondence to the threshold voltage Vtp at the transistor TRP as shown in FIG. 6. The substrate potential Vbb at the transistor TRP can be set freely through the terminal B. Thus, the transistor TRP has a function of adjusting the threshold voltage Vr0 by varying the threshold voltage Vtp in conformance to the voltage Vbb at the terminal B. Through this adjustment function, an adjustment of the threshold voltage (operating point) Vr0 can be achieved in conformance to the characteristics of the ferroelectric capacitor when the process is completed.

If a voltage higher than threshold voltage Vr0 is applied to the gate of the transistor TRP, the connection between the source and the drain is electrically open, the potential at the gate of the transistor TRN is sustained at a low level, the connection between the source and the drain of the transistor TRN is electrically open and the bit line BL1 is caused to float. If a voltage lower than the threshold voltage Vr0 is applied to the gate of the transistor TRP, the connection between the source and the drain is electrically shorted, the potential at the terminal A is applied to the gate of the transistor TRN, the connection between the source and the drain of the transistor TRN is electrically shorted and the bit line BL1 is grounded.

The threshold voltage Vr0 is set by ensuring that; bit line voltage V0<threshold voltage Vr0<bit line voltage V1. It is known that, as presented as an example in FIG. 4, the characteristics (capacity) on the side on which the polarization is inverted tend to change readily whereas the characteristics (capacity) on the polarization non-inversion side are relatively stable when the ferroelectricity characteristics become degraded due to fatigue or the like. Thus, it is desirable to set the threshold voltage Vr0 toward the side on which the polarization is not inverted during a read-out, i.e., closer to the low potential side (toward the bit line voltage V0) of the voltage generated at the bit line BL1, to ensure stable operation.

The operation of the 0-level setting circuit 320 is performed as described below.

If the potential generated at the bit line BL1 is equal to or lower than the threshold voltage Vr0 ("0" state), the bit line BL1 is grounded.

If the potential generated at the bit line BL1 is higher than the threshold voltage Vr0 ("1" state), the bit line BL1 is floated to sustain the potential.

At a time point t4, the level at the terminal SA is raised to amplify the information at the bit line BL1 with the sense amplifier 110, i.e., to amplify the "1" state to the source potential Vcc and amplify the "0" state to 0 V. It is assumed that a given constant voltage is supplied to the sense amplifier 110 as the reference potential Vref at this point. Since the potential at the bit line BL1 is set to 0 V in advance by the 0-level setting circuit 320 if information indicating "0" is present at the bit line BL1, the reference potential Vref needs only to be at a level which corresponds to the detection sensitivity of the sense amplifier 110. For instance, if the detection sensitivity of the sense amplifier 110 is 300 mV, the reference potential Vref may be set to Vref>300 mV.

In addition, since the bit line voltage V1 is generated at the bit line BL1 if information indicating "1" is present at the bit line BL1, the reference potential Vref should be set to; 300 mV<reference potential Vref<bit line voltage V1 by taking into consideration the detection sensitivity of the sense amplifier 110. As the example presented in FIG. 4 indicates, it is known that when the ferroelectricity characteristics have been degraded due to fatigue or the like, the characteristics on the side on which the polarization becomes inverted tend to change readily whereas the characteristics (capacity) on the polarization non-inversion side remain relatively stable. Thus, it is desirable to set the reference potential Vref to a low level within the setting range. The potential on the low potential side, which is sustained by the 0-level setting circuit 320 at a constant level of 0 V and does not change over time, is stable.

In the polarization state shown in FIG. 3, P1 changes to P0' and then to P0 if the "1" state has been written in the memory cell Cm, whereas P0 changes to P0' (the "0" state is written again) if the "0" state has been written in the memory cell Cm.

At a time point t5, the levels at the terminals A and B and the plate line PL are set to 0 V. In the polarization state shown in FIG. 3, P0 changes to P1' and the "1" state is written again if the "1" state has been written in the memory cell Cm, whereas P0' changes to P0 if the "0" state has been written in the memory cell Cm.

At a time point t6, the bit line BL1 is caused to float by setting the level at the terminal SA to 0 V. In the polarization state shown in FIG. 3, P1' changes to P1 if the "1" state has been written in the memory cell Cm, whereas P0 is held if the "0" state has been written in the memory cell, thus rewrite of either data ends.

At a time point t7, the level of the equalize signal EQ is raised to set the bit line BL1 to 0V.

At a time point t8, the level of the equalize signal EQ is lowered to float the bit line BL1, and then the level at the word line WL1 is lowered at a time point t9 to complete the read-out/rewrite operation.

As explained in detail above, the threshold voltage (operating point) of the 0-level setting circuit can be set when the process is completed in the embodiment. In addition, since the 0-level setting circuit 320 is constituted of only two transistors, as shown in FIG. 7, the device area is minimized. Furthermore, since a constant potential can be utilized as the reference potential in the embodiment, a higher degree of stability is achieved and only a lesser degree of change occurs over time compared to the method in which the reference potential is generated by a dedicated capacitor, as explained as the prior art. In addition, since a constant potential Vref is supplied as the reference potential, it is not necessary to set a special capacity for the reference potential line does not require a particularly large capacity. As a result, a reduction in the power consumption is realized.

Fourth Embodiment

Figure 9:
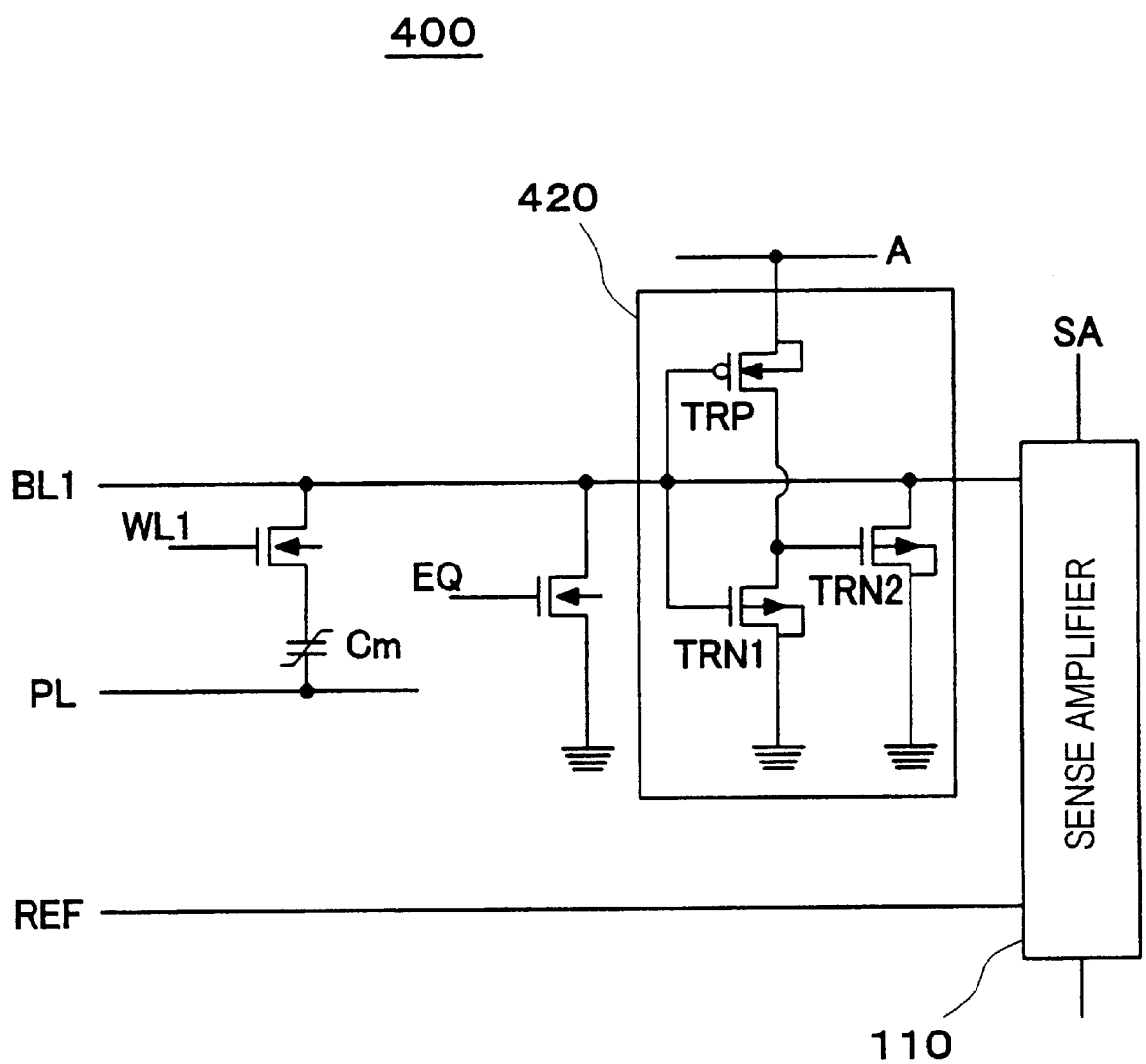
FIG. 9 illustrates the read-out circuit in a fourth embodiment.
Figure 10:
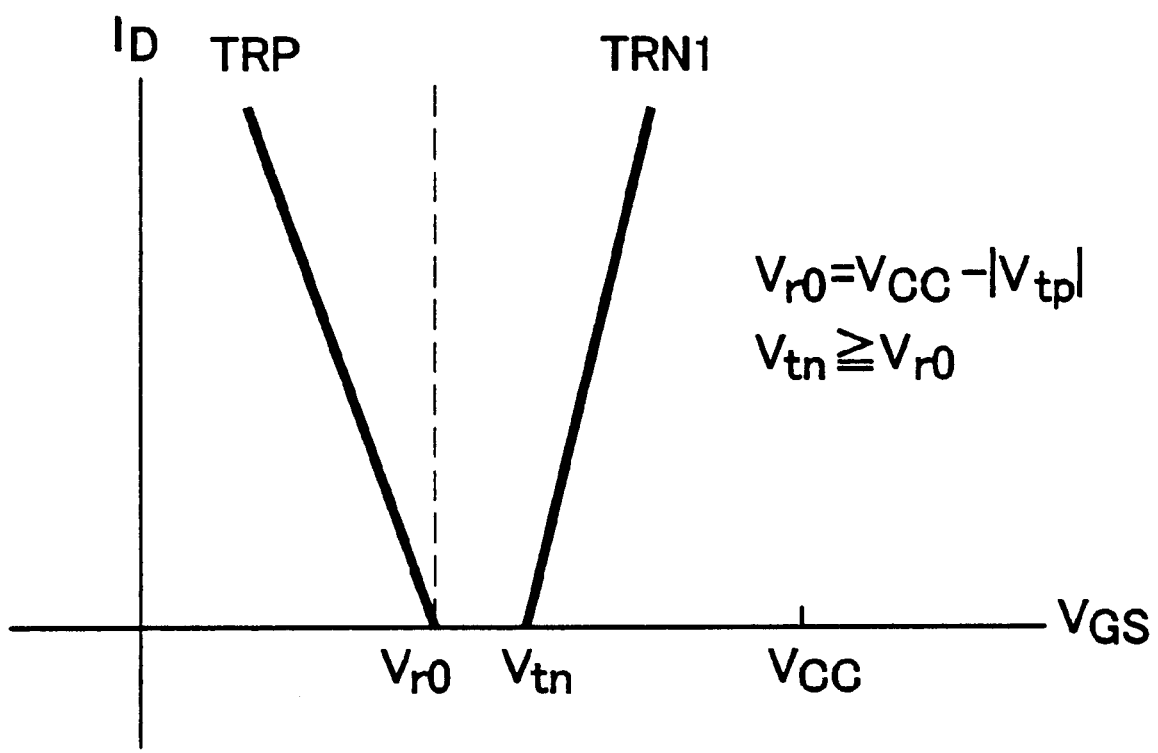
FIG. 10 something a diagram provided to illustrate the threshold of value of voltage (operating point) setting for the 0-level setting circuit.

The fourth embodiment of the present invention is now explained in reference to FIGS. 9 and 10. In reference to the embodiment, the circuit illustrated in FIG. 9 is explained as an example of the 0-level setting circuit mentioned earlier. A 0-level setting circuit 420 comprises an enhancement-type PMOS transistor TRP and enhancement-type NMOS transistors TRN1 and TRN2 as shown in FIG. 9. It is assumed that the transistor TRP is constituted of a PMOS with a small W/L shape and a low drive force.

The 0-level setting circuit 420 engages in operation prior to the sense amplifier operation during a read-out to drive the bit line potential to 0 V when the potential at the bit line BL1 is currently set to "0".

A constant voltage should be supplied to a terminal SA as a reference potential Vref.

FIG. 2 presents a timing chart of the read-out and the rewrite. In the initial state, all the terminals are set at 0 V. First, an equalize signal EQ is raised at a time point t0 to charge the bit line BL1 so as to set the bit line BL1 to 0 V.

After lowering the level of the equalize signal EQ at a time point t1, the level at a word line WL1 is raised to connect a memory cell Cm to the bit line BL1.

At a time point t2, a source potential Vcc is applied to a plate line PL and the information in the memory cell Cm is read-out to the bit line BL1. The level of the potential generated at the bit line BL1 at this point varies depending upon the polarization state of the memory cell Cm. It is assumed that the memory cell Cm is capable of holding information indicating "1" with a residual dielectric polarization P1 and holding information indicating "0" with a residual dielectric polarization P0, as shown in FIG. 3. When information has been written, the memory cell Cm must have either the residual dielectric polarization P1 or the residual dielectric polarization P0.

When the memory cell Cm has the residual dielectric polarization P1, a read-out voltage Vr is divided at the serial circuit constituted of the memory cell Cm and a bit line capacitor Cb by applying the read-out voltage Vr to the plate line PL, resulting in a bit line voltage V1 generated at the two ends of the bit line capacitor Cb, i.e., at the bit line BL1. Likewise, when the memory cell Cm has the residual dielectric polarization P0, the read-out voltage Vr is divided at the serial circuit constituted of the memory cell Cm and the bit line capacitor Cb by applying the read-out voltage Vr to the plate line PL, resulting in a bit line voltage V0 generated at the bit line BL1.

The level at a terminal A is raised at a time point t3 to drive the 0-level setting circuit 420. the 0-level setting circuit 420 has a function of setting only the information indicating "0", i.e., the bit line voltage V0 induced by the residual dielectric polarization P0, to 0V.

Now, the operation of the 0-level setting circuit 420 is explained.

As shown in FIG. 10, the threshold voltage (operating point) of the 0-level setting circuit 420 is determined in correspondence to the threshold voltage Vtp of the transistor TRP and the threshold voltage Vtn of the transistor TRN 1.

A threshold voltage Vr0 used to set the bit line voltage V0 to 0V is set to; threshold voltage Vr0=source potential Vcc−|threshold voltage Vtp|in conformance to the threshold voltage Vtp of the transistor TRP. When the bit line voltage V1 is generated, the threshold voltage Vtn for setting the bit line in a floating state is the threshold voltage of the transistor TRN 1, which is set to satisfy; threshold voltage Vtn≧threshold voltage Vr0.

If a voltage higher than the threshold voltage Vr0 is applied to the gate of the transistor TRP from the bit line BL1, the connection between the source and the drain of the transistor TRP is electrically opened, the potential at the gate of the transistor TRN2 is sustained at a low level, the connection between the source and the drain of the transistor TRN2 is electrically opened and the bit line BL1 is caused to float.

At this time, if the potential at the bit line BL1 is higher than the threshold voltage Vtn, the connection between the source and the drain of the transistor TRN1 is electrically shorted and the connection between the source and the drain of the transistor TRN 2 is electrically opened to set the potential at the gate of the transistor TRN 2 to 0 V, thereby setting the bit line BL1 in a floating state. If the potential at the bit line BL1 is within the range of; threshold voltage Vr0<potential at the bit line BL1<threshold voltage Vtn, the transistor TRN 1 does not function and, as a result, an operation similar to that in the second embodiment is performed.

The charge stored at the transistor TRN 2 is discharged via the pn junction at the drain of the transistor TRP when the terminal A is grounded in the second embodiment. In this embodiment, the charge stored at the gate of the transistor TRN 2 can be forcibly discharged by the transistor TRN 1. Thus, since no residual charge remains at the gate of the transistor TRN 2 even during a high-speed operation, stable operation is enabled.

If a voltage lower than the threshold voltage Vr0 is applied to the gate of the transistor TRP, the connection between the source and the drain is electrically shorted, the potential at the terminal A is applied to the gate of the transistor TRN 2, the connection between the source and the drain of the transistor TRN 2 is electrically shorted and the bit line BL1 is grounded.

The threshold voltage Vr0 is set by ensuring that; bit line voltage V0<threshold voltage Vr0<bit line voltage V1. It is known that, as presented as an example in FIG. 4, the characteristics (capacity) on the side on which the polarization is inverted tend to readily change whereas the characteristics (capacity) on the polarization non-inversion side are relatively stable when the ferroelectricity characteristics become degraded due to fatigue or the like. Thus, it is desirable to set the threshold voltage Vr0 toward the side on which the polarization is not inverted during a read-out, i.e., closer to the low potential side (toward the bit line voltage V0) of the voltage generated at the bit line BL1, to ensure stable operation.

The operation of the 0-level setting circuit 420 is performed as described below.

If the potential generated at the bit line BL1 is equal to or lower than the threshold voltage Vr0 ("0" state), the bit line BL1 is grounded.

If the potential generated at the bit line BL1 is higher than the threshold voltage Vr0 ("1" state), the bit line BL1 is floated to sustain the potential.

At a time point t4, the level at the terminal SA is raised to amplify the information at the bit line BL1 with the sense amplifier 110, i.e., to amplify the "1" state to the source potential Vcc and amplify the "0" state to 0 V. It is assumed that a given constant voltage is supplied to the sense amplifier 110 as the reference potential Vref at this point. Since of the potential at the bit line BL1 is set to 0 V in advance by the 0-level setting circuit 420 if information indicating "0" is present at the bit line BL1, the reference potential Vref needs only to be at a level which corresponds to the detection sensitivity of the sense amplifier 110. For instance, if the detection sensitivity of the sense amplifier 110 is 300 mV, the reference potential Vref may be set to Vref>300 mV.

In addition, since the bit line voltage V1 is generated at the bit line BL1 if information indicating "1" is present at the bit line BL1, the reference potential Vref should be set to; 300 mV<reference potential Vref<bit line voltage V1 by taking into consideration the detection sensitivity of the sense amplifier 110. As the example presented in FIG. 4 indicates, it is known that when the ferroelectricity characteristics have been degraded due to fatigue or the like, the characteristics on the side on which the polarization becomes inverted tend to change readily whereas the characteristics (capacity) on the polarization non-inversion side remain relatively stable. Thus, it is desirable to set the reference potential Vref to a low level within the setting range. The potential on the low potential side, which is sustained by the 0-level setting circuit 420 at a constant level of 0 V and does not change over time, is stable.

In the polarization state shown in FIG. 3, P1 changes to P0' and then to P0 if the "1" state has been written in the memory cell Cm, whereas P0 changes to P0' (the "0" state is written again) if the "0" state has been written in the memory cell Cm.

At a time point t5, the levels at the terminal A and the plate line PL are set to 0 V. In the polarization state shown in FIG. 3, P0 changes to P1' and the "1" state is written again if the "1" state has been written in the memory cell Cm, whereas P0' changes to P0 if the "0" state has been written in the memory cell Cm.

At a time point t6, the bit line BL1 is caused to float by setting the level at the terminal SA to 0 V. In the polarization state shown in FIG. 3, P1' changes to P1 if the "1" state has been written in the memory cell Cm, whereas P0 is held if the "0" state has been written in the memory cell Cm, thereby ending rewrite of either data.

At a time point t7, the level of the equalize signal EQ is raised to set the bit line BL1 to 0V.

At a time point t8, the level of the equalize signal EQ is lowered to float the bit line BL1, and then the level at the word line WL1 is lowered at a time point t9 to complete the read-out/rewrite operation.

As explained in detail above, a high degree of stability is achieved even during a high-speed operation in the embodiment since the charge stored at the gate of the transistor TRN2 can be extracted through the transistor TRN1. In addition, since a constant potential can be utilized as the reference potential, a higher degree of stability is achieved and only a lesser degree of change occurs over time compared to the method in which the reference potential is generated by a dedicated capacitor, as explained as the prior art. Furthermore, since a constant potential Vref is supplied as the reference potential, the reference potential line does not require a particularly large capacity. As a result, a reduction in the power consumption is realized.

Fifth Embodiment

Figure 11:
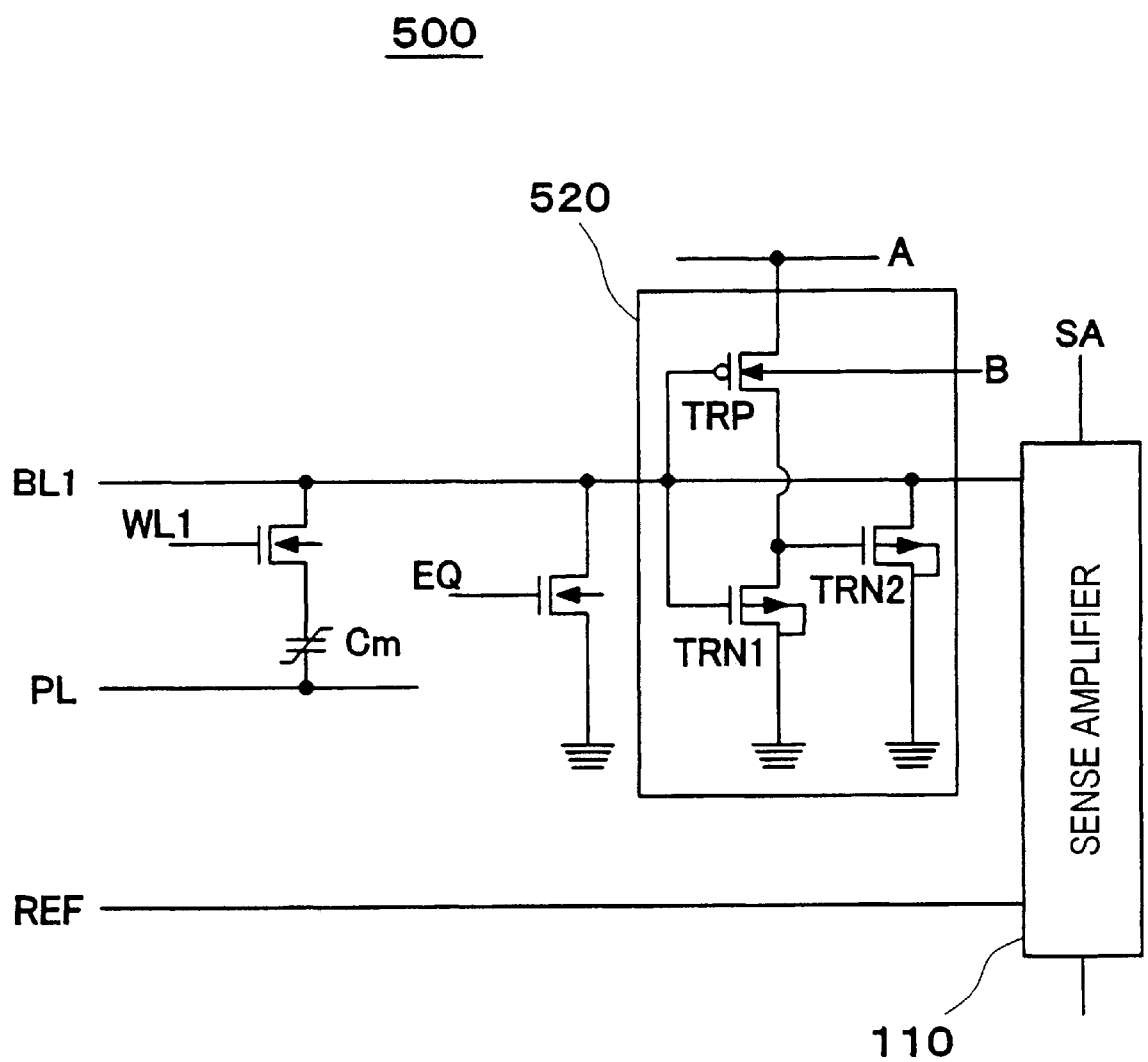
FIG. 11 illustrates the read-out circuit in a fifth embodiment.

The fifth embodiment of the present invention is now explained in reference to FIG. 11. In reference to the embodiment, the circuit illustrated in FIG. 11 is explained as an example of the 0-level setting circuit mentioned earlier. A 0-level setting circuit 520 comprises an enhancement-type PMOS transistor TRP and enhancement-type NMOS transistors TRN 1 and TRN 2 as shown in FIG. 11. It is assumed that the transistor TRP is constituted of a PMOS with a small W/L shape and a low drive force. In addition, the substrate potential at the transistor TRP can be extracted through a terminal B for control.

The 0-level setting circuit 520 engages in operation prior to the sense amplifier operation during a read-out to drive the bit line potential to a voltage Vbb which has been arbitrarily set when the potential at a bit line BALANCE1 is currently set to "0".

A constant voltage should be supplied to a terminal SA as a reference potential Vref.

FIG. 8 presents a timing chart of the read-out and the rewrite. In the initial state, all the terminals are set at 0 V. First, an equalize signal EQ is raised at a time point t0 to charge the bit line BL1 so as to set the bit line BL1 to 0 V.

After lowering the level of the equalize signal EQ at a time point t1, the level at a word line WL1 is raised to connect a memory cell Cm to the bit line BL1. The arbitrary voltage Vbb is applied to the terminal B.

At a time point t2, a source potential Vcc is applied to a plate line PL and the information in the memory cell Cm is read-out to the bit line BL1. The level of the potential generated at the bit line BL1 at this point varies depending upon the polarization state of the memory cell Cm. It is assumed that the memory cell Cm is capable of holding information indicating "1" with a residual dielectric polarization P1 and holding information indicating "0" with a residual dielectric polarization P0. When information has been written, the memory cell Cm must have either the residual dielectric polarization P1 or the residual dielectric polarization P0.

When the memory cell Cm has the residual dielectric polarization P1, a read-out voltage Vr is divided at the serial circuit constituted of the memory cell Cm and a bit line capacitor Cb by applying the read-out voltage Vr to the plate line PL, resulting in a bit line voltage V1 generated at the two ends of the bit line capacitor Cb, i.e., at the bit line BL1. Likewise, when the memory cell Cm has the residual dielectric polarization P0, the read-out voltage Vr is divided at the serial circuit constituted of the memory cell Cm and the bit line capacitor Cb by applying the read-out voltage Vr to the plate line PL, resulting in a bit line voltage V0 generated at the bit line BL1.

The level at a terminal A is raised at a time point t3 to drive the 0-level setting circuit 520. The 0-level setting circuit 520 has a function of setting only the information indicating "0", i.e., the bit line voltage V0 induced by the residual dielectric polarization P0, to 0V.

Now, the operation of the 0-level setting circuit 520 is explained.

As shown in FIG. 10, the threshold voltage (operating point) of the 0-level setting circuit 520 is determined in correspondence to the threshold voltage Vtp of the transistor TRP and the threshold voltage Vtn of the transistor TRN 1. A threshold voltage Vr0 used to set the bit line voltage V0 to 0V is set to; threshold voltage Vr0=source potential Vcc−|threshold voltage Vtp|in conformance to the threshold voltage Vtp of the transistor TRP. When the bit line voltage V1 is generated, the threshold voltage Vtn for setting the bit line in a floating state is the threshold voltage of the transistor TRN 1, which is set to satisfy; threshold voltage Vtn≧threshold voltage Vr0.

The substrate potential Vbb at the transistor TRP can be set freely through the terminal B. Thus, the transistor TRP has a function of adjusting the threshold voltage Vr0 by varying the threshold voltage Vtp in conformance to the voltage Vbb at the terminal B. Through this adjustment function, an adjustment of the threshold voltage Vr0 can be achieved in conformance to the characteristics of the ferroelectricity capacitor when the process is completed.

If a voltage higher than the threshold voltage Vr0 is applied to the gate of the transistor TRP from the bit line BL1, the connection between the source and the drain of the transistor TRP is electrically opened, the potential at the gate of the transistor TRN2 is sustained at a low level, the connection between the source and the drain of the transistor TRN2 is electrically opened and the bit line BL1 is caused to float.

At this time, if the potential at the bit line BL1 is higher than the threshold voltage Vtn, the connection between the source and the drain of the transistor TRN1 is electrically shorted and the connection between the source and the drain of the transistor TRN 2 is electrically opened to set the potential at the gate of the transistor TRN 2 to 0 V, thereby setting the bit line BL1 in a floating state.

If the potential at the bit line BL1 is within the range of; threshold voltage Vr0<potential at bit line BL1<threshold voltage Vtn, the transistor TRN 1 does not function and, as a result, an operation similar to that in the third embodiment is performed.

The charge stored at the gate of the transistor TRN 2 is discharged via the pn junction at the drain of the transistor TRP when the terminal B is grounded in the third embodiment. In this embodiment, the charge stored at the gate of the transistor TRN 2 can be forcibly discharged by the transistor TRN 1. Thus, since no residual charge remains at the gate of the transistor TRN 2 even during a high-speed operation, stable operation is enabled.

If a voltage lower than the threshold voltage Vr0 is applied to the gate of the transistor TRP, the connection between the source and the drain is electrically shorted, the potential at the terminal A is applied to the gate of the transistor TRN 2, the connection between the source and the drain of the transistor TRN 2 is electrically shorted and the bit line BL1 is grounded.

The threshold voltage Vr0 is set by ensuring that; bit line voltage V0<threshold voltage Vr0<bit line voltage V1. It is known that, as presented as an example in FIG. 4, the characteristics (capacity) on the side on which the polarization is inverted tend to change readily whereas the characteristics (capacity) on the polarization non-inversion side are relatively stable when the ferroelectricity characteristics become degraded due to fatigue or the like. Thus, it is desirable to set the threshold voltage Vr0 toward the side on which the polarization is not inverted during a read-out, i.e., closer to the low potential side (toward the bit line voltage V0) of the voltage generated at the bit line BL1, to ensure stable operation.

The operation of the 0-level setting circuit 520 is performed as described below.

If the potential generated at the bit line BL1 is equal to or lower than the threshold voltage Vr0 ("0" state), the bit line BL1 is grounded.

If the potential generated at the bit line BL1 is higher than the threshold voltage Vr0 ("1" state), the bit line BL1 is floated to sustain the potential.

At a time point t4, the level at the terminal SA is raised to amplify the information at the bit line BL1 with the sense amplifier 110, i.e., to amplify the "1" state to the source potential Vcc and amplify the "0" state to 0 V. It is assumed that a given constant voltage is supplied to the sense amplifier 110 as the reference potential Vref at this point. Since the potential at the bit line BL1 is set to 0 V in advance by the 0-level setting circuit 520 if information indicating "0" is present at the bit line BL1, the reference potential Vref needs only to be at a level which corresponds to the detection sensitivity of the sense amplifier 110. For instance, if the detection sensitivity of the sense amplifier 110 is 300 mV, the reference potential Vref may be set to Vref>300 mV.

In addition, since the bit line voltage V1 is generated at the bit line BL1 if information indicating "1" is present at the bit line BL1, the reference potential Vref should be set to; 300 mV<reference potential Vref<bit line voltage V1 by taking into consideration the detection sensitivity of the sense amplifier 110. As the example presented in FIG. 4 indicates, it is known that when the ferroelectricity characteristics have been degraded due to fatigue or the like, the characteristics on the side on which the polarization becomes inverted tend to change readily whereas the characteristics (capacity) on the polarization non-inversion side remain relatively stable. Thus, it is desirable to set the reference potential Vref to a low level within the setting range. The potential on the low potential side, which is sustained by the 0-level setting circuit 520 at a constant level of 0 V and does not change over time, is stable.

In the polarization state shown in FIG. 3, P1 changes to P0' and then to P0 if the "1" state has been written in the memory cell Cm, whereas P0 changes to P0' (the "0" state is written again) if the "0" state has been written in the memory cell Cm.

At a time point t5, the levels at the terminals A and B and the plate line PL are set to 0 V. In the polarization state shown in FIG. 3, P0' changes to P0 and the "1" state is written again if the "1" state has been written in the memory cell Cm.

At a time point t6, the bit line BL1 is caused to float by setting the level at the terminal SA to 0 V. In the polarization state shown in FIG. 3, P1' changes to P1 if the "1" state has been written in the memory cell Cm, whereas P0 is held if the "0" state has been written in the memory cell Cm, thereby ending rewrite of either data.

At a time point t7, the level of the equalize signal EQ is raised to set the bit line BL1 to 0V.

At a time point t8, the level of the equalize signal EQ is lowered to set the bit line BL1 in a floating state, and then the level at the word line WL1 is lowered at a time point t9 to complete the read-out/rewrite operation.

As explained in detail above, a high degree of stability is achieved even during a high-speed operation in the embodiment since the charge stored at the gate of the transistor TRN2 can be extracted through the transistor TRN1. It is also possible to set the threshold voltage (operating point) of the 0-level setting circuit 520 after the process is completed. In addition, since a constant potential can be utilized as the reference potential, a higher degree of stability is achieved and only a lesser degree of change occurs over time compared to the method in which the reference potential is generated by a dedicated capacitor, as explained as the prior art. Furthermore, since a constant potential Vref is supplied as the reference potential, the reference potential line does not require a particularly large capacity. As a result, a reduction in the power consumption is realized.

While the invention has been particularly shown and described with respect to preferred embodiments of the read-out circuit according to the present invention by referring to the attached drawings, the present invention is not limited to these examples and it will be understood by those skilled in the art that various changes in form and detail may be made therein without departing from the spirit, scope and teaching of the invention.

As explained in detail in reference to the embodiments, by adopting the 0-level setting circuit according to the present invention in a 1T-1C FRAM device, a highly reliable ferroelectricity memory capable of performing stable read-out is realized.

As is obvious from the detailed explanation of the operation of the 0-level setting circuit according to the present invention, the 0-level setting circuit according to the present invention may also be adopted in a 2T-2C type FRAM device.

As is obvious from the detailed explanation of the operation achieved in the 0-level setting circuit according to the present invention, the 0-level setting circuit according to the present invention may also be adopted in another type of memory device having a system for detecting a potential difference manifesting at a bit line.

As explained above, according to the present invention in which a constant potential can be used as a reference potential, a higher degree of stability is achieved and a lesser degree of change occurs over time compared to the method in which the reference potential is generated by a dedicated capacitor as explained as the prior art. In addition, since a constant potential Vref can be supplied as the reference potential, it is not necessary to set a particular capacity for the reference potential line, thereby achieving a reduction in power consumption.

Since the present invention does not require numerous additional elements, the device area is minimized, thereby preventing the problem of an increase in the area.

Furthermore, since the operating point of the potential setting circuit can be set after the process is completed, the operating point of the potential setting circuit can be set freely in conformance to the requirements of a specific use.

Moreover, a high degree of stability is achieved even during a high-speed operation.

What is claimed is:

1. A read-out circuit that amplifies a binary signal through a sense amplifier and reads out the amplified signal as a bit line potential, with said read out circuit being provided with a potential setting circuit that resets a lower potential signal in the binary signal to a given potential, located at a stage preceding said sense amplifier; and wherein said potential setting circuit includes a first transistor with a substrate potential that can be set freely, and the operating point of said potential setting circuit can be adjusted in conformance to the substrate potential of said transistor.

2. A read-out circuit according to claim 1, wherein; said potential setting circuit resets the lower potential signal to a potential near 0 V.

3. A read-out circuit according to claim 1, wherein; said potential setting circuit includes said first transistor and another transistor that forcibly discharges an electrical charge stored at the gate of said first transistor.

4. A read-out circuit that amplifies a binary signal through a sense amplifier and reads out the amplified signal as a bit line potential, with said read out circuit being provided with a potential setting circuit that resets a lower potential signal in the binary signal to a given potential, located at a stage preceding said sense amplifier; and wherein said potential setting circuit includes a first transistor and another transistor that forcibly discharges an electrical charge stored at the gate of said first transistor.

5. A read-out circuit that amplifies a binary signal through a sense amplifier and reads out the amplified signal as a bit line potential, with said read out circuit being provided with a potential setting circuit that resets a lower potential signal in the binary signal to a given potential, located at a stage preceding said sense amplifier; and, wherein said potential setting circuit resets the lower potential signal to a potential near 0 V, and includes a first transistor and another transistor that forcibly discharges an electrical charge stored at the gate of said first transistor.

6. A read-out circuit that amplifies a binary signal through a sense amplifier and reads out the amplified signal as a bit line potential, having a potential setting circuit that resets a lower potential signal in the binary signal to a given potential, provided at a stage preceding said sense amplifier, and wherein said potential setting circuit includes:
  a first transistor having a gate thereof connected to a bit line, which is turned on when the potential generated at said bit line is equal to or lower than a specific threshold voltage; and
  a second transistor which is turned on in response to said first transistor entering an ON state and resets the potential at said bit line to a given potential.

7. A read-out circuit according to claim 6, wherein
said potential setting circuit includes a third transistor provided to forcibly release an electrical charge accumulated at a gate of said second transistor.

8. A read-out circuit according to claim 6, wherein
a terminal of said second transistor is grounded and said second transistor resets the potential at said bit line to a potential near 0 V.

9. A read-out circuit according to claim 8, wherein
the substrate potential at said first transistor can be set freely and the operating point of said potential setting circuit can be adjusted in conformance to the substrate potential at said first transistor.

10. A read-out circuit according to claim 8, wherein
said potential setting circuit includes a third transistor provided to forcibly release an electrical charge accumulated at a gate of said second transistor.

11. A read-out circuit according to claim 6, wherein
the substrate potential at said first transistor can be set freely and the operating point of said potential setting circuit can be adjusted in conformance to the substrate potential at said first transistor.

12. A read-out circuit according to claim 11, wherein
said potential setting circuit includes a third transistor provided to forcibly release an electrical charge accumulated at a gate of said second transistor.

* * * * *